United States Patent [19]

Rodder

[11] Patent Number: 5,213,990

[45] Date of Patent: May 25, 1993

[54] METHOD FOR FORMING A STACKED SEMICONDUCTOR STRUCTURE

[75] Inventor: Mark S. Rodder, University Park, Tex.

[73] Assignee: Texas Instruments, Incorporated, Dallas, Tex.

[21] Appl. No.: 861,688

[22] Filed: Apr. 1, 1992

[51] Int. Cl.⁵ ............................................ H01L 21/265
[52] U.S. Cl. ........................................ 437/40; 437/52; 437/59; 437/913; 437/915; 148/DIG. 53; 148/DIG. 109
[58] Field of Search ................. 437/40, 41, 56, 59, 437/47, 228, 915, 913; 148/DIG. 53, DIG. 109

[56] References Cited

U.S. PATENT DOCUMENTS

| | | | |
|---|---|---|---|
| 4,609,407 | 9/1986 | Masao et al. | 437/56 |
| 4,735,915 | 4/1988 | Kita et al. | 437/59 |
| 4,874,719 | 10/1989 | Kurosawa | |
| 4,876,215 | 10/1989 | Hsu | 437/52 |
| 4,980,308 | 12/1990 | Hayashi et al. | 437/41 |
| 4,984,200 | 11/1991 | Saitoo et al. | 437/52 |
| 5,016,070 | 5/1991 | Sundaresan | 357/41 |
| 5,114,879 | 5/1992 | Madan | 437/59 |
| 5,128,738 | 7/1992 | Lee et al. | 357/41 |

Primary Examiner—Brian E. Hearn
Assistant Examiner—Michael Trinh
Attorney, Agent, or Firm—Peter B. Barndt; James C. Kesterson; Richard L. Donaldson

[57] ABSTRACT

A method for connecting different conducting layers of a microelectronic device is disclosed. The method comprises: providing a first conducting layer (40); forming a first insulating layer (42) over said first conducting layer (40); forming a second conducting layer over said first insulating layer (42); patterning said second conducting layer to form a conducting element (44) over said first insulating layer (42) whereby the top surface of said first insulating layer (42) is protected from deleterious effects of further process steps; forming a second insulating layer (46) over said conducting element (44) and said first insulating layer (42) selectively removing said first insulating layer (42) and said second insulating layer (46), using an etch process which is selective over said insulating layers (42, 46) said conducting element (44) and said first conducting layer (40), to form a contact region (48) which straddles an edge of said conducting element (44) such that a portion of said conducting element (44) is exposed adjacent to an exposed portion of said conducting layer (40) with said first insulating layer (42) vertically interposed; and forming a third conducting layer (50) within said contact area (48). Other methods are also disclosed.

6 Claims, 5 Drawing Sheets

METHOD FOR FORMING A STACKED SEMICONDUCTOR STRUCTURE

CROSS-REFERENCE TO RELATED APPLICATIONS

The following coassigned patent applications are hereby incorporated herein by reference:

| Ser. No. | Filing Date | TI Case No. |
|---|---|---|
| 609,969 | 12/10/90 | TI-13486.1 |
| 642,168 | 1/17/91 | TI-13486A |

FIELD OF THE INVENTION

This invention pertains to integrated circuit fabrication, and more particularly to a transistor with elevated source/drain (moat) regions and the process of fabrication thereof. This invention further relates to a method for forming a "stacked" semiconductor structure (i.e. a structure with active elements which are formed physically above the semiconductor substrate devices and their associated interconnects and insulators). This invention also relates to any semiconductor structure having multiple-level interconnects.

BACKGROUND OF THE INVENTION

Without limiting the scope of the invention, its background is described in connection with methods for forming a stacked, six transistor static memory cell using MOSFET technology or stacked 6T SRAM as an example.

Under current MOSFET transistor technology, problems associated with short channel effects, source/drain (moat) junction capacitance, reliability and packing density arise as MOSFET technology is scaled to smaller dimensions.

MOSFET short channel effects increase as the source/drain junction depth increases. Thus, it is desirable to minimize the depth of such junctions, especially as the length of the transistor decreases. One approach to minimizing source/drain junction depth, with respect to the gate oxide/silicon substrate interface, is to form raised source/drain regions.

MOSFET source/drain junction capacitance increases as source/drain junction area increases. Thus, it is desirable to minimize the moat area, which will also improve the packing density of integrated circuits. One approach is to form contacts from metal-1 to the source/drain regions over field oxide, rather than directly over the moat regions.

Under standard MOS transistor design, the source/drain area must considerably exceed the contact to metal-1 size to prevent junction leakage into the underlying substrate. This is a result of potential etching error due to misalignment of the contact to metal-1 over the source/drain area. If the contact overlies the source/drain, the contact etch may penetrate the PN junction edge of the source/drain, thereby short-circuiting that junction. However, if the contact can overlie field oxide, there is no need for the larger source/drain area. Thus, the source/drain area may be reduced with a corresponding reduction in size of the transistor. Reduced transistor size gives rise to higher packing density.

Previously developed attempts to form a conducting layer from moat over field oxide in addition to the formation of raised moat regions have created attendant problems. Quite often, the processes involved are complicated and require extreme process control.

One such prior attempt comprises the non-reactive UPMOS process. This process deposits source/drain polysilicon over a patterned gate structure followed by resist planarization and etch-back. The etch removes the polysilicon over the gate, while not removing the polysilicon over the moat and field oxide regions. This process has the disadvantages of utilizing a resist-etch-back (REB) process to define the final thickness of the polysilicon over the moat regions. In particular, the REB process does not utilize an etch-stop layer and thus can lead to difficulty in control and uniformity of the final polysilicon thickness over moat. It should be noted that the final polysilicon thickness ultimately determines the source/drain junction depth of the resulting MOSFET device.

A second prior art solution is the reactive UPMOS process. In this process, a dopant diffusion source over a patterned gate is used to dope the polysilicon deposited over the patterned gate, followed by a selective etch process. In this process, the doped polysilicon (over the gate) is etched faster than the undoped polysilicon which lies over the moat and field oxide regions. This process has several disadvantages. First, the use of a diffusion process to dope the overlying polysilicon is unreliable. The diffusion process is not precisely controllable due to both interfacial oxide effects between the dopant source and the overlying polysilicon and also due to the adverse characterized diffusion of dopants in polysilicon. Second, a selective etch with no etch-stop mask can cause difficulties in the control and uniformity of precise polysilicon thickness over moat. Third, a high gate-to-source/drain capacitance can result if insufficient dopant diffusion reaction causes the remaining polysilicon thickness over moat to be equivalent to the thickness of the gate stack.

A third prior art solution has comprised a TiN process which forms a TiN layer extending from the moat over the field oxide regions. This process, even if used in conjunction with selective epitaxy to form raised moat regions, requires a large moat width (and thus area) since the TiN layer must overlap the moat by approximately 0.8 μm to satisfy minimum contact resistance requirements. Due to large moat width, there is a consequent requirement of larger device size. Further, the larger moat area required by the TiN process thus results in an increased source/drain junction capacitance.

In addition to forming the aforementioned standard MOSFET (typically the N-channel MOSFET), in the example of a stacked 6T SRAM it is necessary to connect the gate of the aforementioned MOSFET to the semiconductor film of a thin film transistor (TFT) MOSFET (typically a P-channel MOSFET). The process used to make this connection in prior art stacked 6T SRAMs is generally independent of the process used to form the standard MOSFET. Hence, the prior art connection method described below may be regarded as applying to any of the aforementioned prior art MOSFET methods.

The prior art process steps which follow one of the aforementioned methods for forming the standard MOSFET transistor consist of depositing an interlevel oxide (ILO) to provide isolation between conductive elements, opening contact holes in ILO, depositing TFT gate material on top of ILO and above appropriate contact hole etched in the ILO to form a connection between the lower level conductors and the TFT gate material, patterning the TFT gate material to form a gate for a first TFT, depositing TFT gate oxide, patterning/etching a hole in TFT gate oxide above TFT gate material, depositing TFT semiconductor film for a second TFT on top of gate oxide and above appropriate contact hole etched in the gate oxide to form a connection between the gate of the first TFT and the semiconductor film of the second TFT. Several disadvantages exist with this prior art method. One disadvantage is that this method requires patterning of resist on top of the TFT gate oxide layer, thus leading to the possibility of chemical contamination of the TFT gate oxide arising from contact between the gate oxide and the resist prior to deposition of the TFT semiconductor film. Such chemical contamination can lead to defects and associated breakdown of the oxide when a voltage is applied across the oxide. Another disadvantage is the possibility of interfacial oxide on the TFT gate forming in the area of the contact hole—hindering the connection between the TFT gate and the TFT channel film. Using the prior art technique, a hydrogen fluoride (HF) deglaze to remove this interfacial oxide prior to TFT channel film deposition, can lead to non-uniform wet etching of the TFT gate oxide, especially in areas where the TFT gate oxide overlies corners of underlying topography for which the oxide might be thinner or under stress. Still another disadvantage is the necessity to deposit the TFT channel film overlapping the contact hole in the gate oxide to compensate for layer to layer mask misalignment.

Therefore, a need has arisen for a simple and more reliable process to create a 6T stacked SRAM structure having transistors with raised source/drain regions and with a conducting layer extending from moat regions over field oxide regions. A need further exists for a more reliable method to connect different layers of semiconductor and/or conductor materials with interposing insulator layers. More specifically, a need exists for a method to connect the TFT gate for a first TFT in this 6T stacked SRAM to the TFT semiconductor film for a second TFT.

SUMMARY OF THE INVENTION

In an illustrative embodiment of the present invention, a new and improved stacked semiconductor structure is provided which substantially reduces or eliminates the disadvantages and problems associated with prior semiconductor structures.

In accordance with this embodiment, a transistor is formed having a gate oxide over a semiconductor surface and between opposing moat insulating regions. A gate is formed over the gate oxide. Sidewall insulators are formed adjacent the gate. A polysilicon layer is formed over the opposing moat insulating regions and partially over the semiconductor surface, thereby defining interim areas between the sidewall insulators and the edge of the polysilicon. A conductive layer is then formed selectively over the polysilicon layer and in the interim areas. Source/drain regions are then implanted in the moat area. Silicided regions are then formed over the conductive layer and can be connected to local interconnects. Interlevel oxide (ILO) is formed to provide isolation between conductive element layers. A thin film transistor (TFT) gate material is deposited, patterned and etched (and implanted, if desired). The TFT gate oxide is deposited. The TFT semiconductor film is deposited, patterned and etched above the TFT gate oxide to form discrete circuit elements which terminate partially above underlying circuit elements (with TFT gate oxide vertically interposed) to which they will be connected. A masking oxide is then deposited. A photoresist layer is now formed over the masking oxide and patterned to form a contact region overlapping the endpoint of the discrete TFT semiconductor element (for a first TFT) and a portion of the underlying circuit element (typically a TFT gate for a second TFT). Oxide material within this contact area is now selectively etched such that the masking oxide and the gate oxide are removed within this window, but the TFT semiconductor film and the TFT gate oxide which it overlies is not removed. In this manner, the remaining TFT gate oxide is insulated from contact with photoresist formation and stripping steps which can introduce chemical impurities onto exposed surfaces. A second conductive layer is then formed by means of a selective growth technique to connect the now exposed TFT channel film and TFT gate.

The present invention also allows use of selective growth techniques further comprising in-situ cleaning processes, which are well known in the art of selective semiconductor growth, to avoid any problems associated with oxide formation on the TFT gate region.

A further advantage of the present invention is the depositing of the TFT channel film directly over the gate oxide layer before any patterning of the gate oxide. In this manner, the gate oxide material which underlies the TFT channel film avoids the chemical impurities or other impurities introduced in the photoresist deposit/-pattern/strip process.

In the illustrative embodiment of the present invention, the overlap of the polysilicon layer over moat need only be on the order of 0.3 μm, thereby reducing device size. Reduced device size has the technical advantages of increasing packing density and reducing source/-drain junction capacitance.

In the illustrative embodiment of the present invention, large overlap of the polysilicon layer over moat is not required to minimize contact resistance. A small overlap of the polysilicon layer over moat is required to account for misalignment error with respect to the edge of the field oxide. However, such overlap is minimal due to the fact that such oxide is etched away before depositing a conductive layer. Further, in the illustrated embodiment, misalignment tolerance is reduced by approximately the thickness of the conductive layer as it forms a sidewall along the previously patterned polysilicon layer, thereby reducing the tolerance for defining the polysilicon over moat. Further, by using selective growth techniques to connect the TFT semiconductor film to the TFT gate, it is not necessary for the TFT semiconductor film to overlap the contact hole—further increasing packing density. A further advantage is accomplished in this invention by using a masking insulator to define the contact areas for selective semiconductor growth techniques and thereby avoiding semiconductor growth over areas where such growth could affect device performance.

In comparison to prior processes, the preferred embodiment of the present invention utilizes well controlled etch techniques to define the polysilicon layer. This is effected by utilizing an underlying oxide layer as an etch-stop layer when defining the polysilicon layer. The use of this etch-stop layer provides the technical advantage of improved control and uniformity across the wafer, since the etching need not be a timed etch and allows for the use of overetch without altering any resultant thickness of polysilicon over the moat regions.

In addition, another important technical advantage of the invention is the use of a second conductive layer to subsequently form the raised moat regions while enabling an electrical connection between the moat and the polysilicon layer over the insulating regions. This structure has the technical advantage that the silicon thickness in the moat regions can be well controlled and is also independent of the thickness of the polysilicon layer. The control obtained from using selective deposition of a conductive layer provides the technical advantage of precise determination of source/drain junction depth. It is noted that the source/drain junction depth (with respect to the gate oxide/silicon substrate interface) is reduced by the thickness of the conducting layer, thus leading to shallow, heavily doped junctions. This decreased junction depth for the heavily doped regions leads to improved MOSFET performance and a reduction in MOSFET short channel effects.

Another technical advantage is that control of the thickness of the selectively deposited conducting layer is also important to minimize the gate-to-source/drain capacitance. Gate-to-source/drain capacitance increases as the thickness of the conducting layer increases. Therefore, by controlling the precise thickness of the conducting layer, MOSFET device performance can be optimized with respect to both the junction depth and gate-to-source/drain capacitance issues. The thickness of the conducting layer can be easily controlled to be much less than the height of the gate thus leading to reduced gate-to-source/drain capacitance compared to prior processes.

Another technical advantage of the present invention is that a structure is created wherein the moat silicon is effectively extended over the field insulating region. With this extension, the contact to metal-1 need not be centered in the moat regions, but may instead be positioned partially or entirely over the field insulating region. This provides the technical advantage of allowing the etching process for the contact hole to be effected either partially or entirely over the insulating regions rather than over moat. Therefore, the possibility of etch damage to the device in the moat region, and corresponding increase in junction leakage current in the moat regions, can be eliminated. Another technical advantage is that the moat area is substantially reduced by forming the contact over the insulating region.

BRIEF DESCRIPTION OF THE DRAWINGS

For a more complete understanding of the preferred embodiment of the present invention and the advantages thereof, reference is now made to the following descriptions, taken in conjunction with the accompanying drawings, in which.

DETAILED DESCRIPTION OF THE INVENTION

The preferred embodiment of the present invention is illustrated in FIGS. 1-16 of the drawings, like numerals being used to refer to like and corresponding parts of the various drawings. FIGS. 1-15 illustrate cross-sectional side views of the present invention throughout various processing steps. FIG. 16 schematically illustrates a 6T SRAM cell and associated circuitry incorporated in the preferred embodiment of the present invention.

Figure 1:
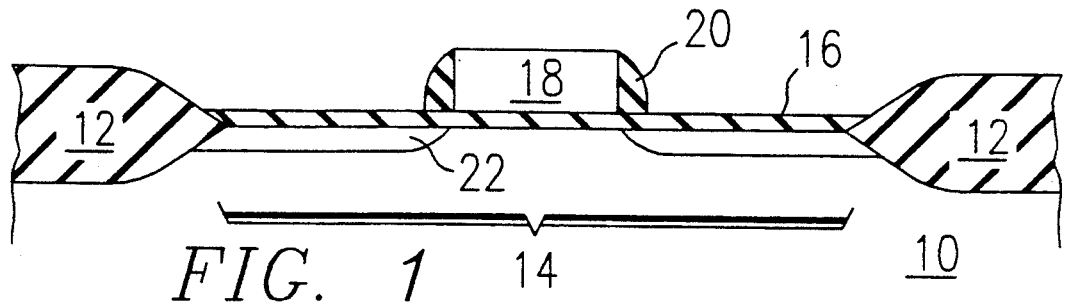
FIG. 1 illustrates a cross-sectional side view of the transistor of the preferred embodiment of the present invention after a first processing stage.

FIG. 1 illustrates a cross-sectional side view of the silicon substrate 10 after a first processing stage. Patterned insulating regions 12 are formed on the silicon substrate 10, defining a moat region 14 isolated by the insulating regions 12. Typically, the insulating region 12 is formed by growing a field oxide on the silicon substrate 10, which has been masked by a patterned layer such as silicon nitride to prevent oxidation over moat region 14. A gate insulator 16 is formed along the surface of the silicon substrate 10 between the insulating regions 12, typically grown at a thickness of 50–200 Å. A gate 18 is deposited above the gate insulator 16. Typically, the gate 18 comprises highly doped polysilicon layer which is etched by a conventional techniques to the desired configuration. Shallow junctions 22 may be optionally implanted throughout the moat region 14, but do not form under the gate 18. For the preferable NMOS transistor, the doping for the shallow junctions 22 typically results in an arsenic surface concentration of approximately $10^{17}$–$10^{19}$/cm$^3$. The use of arsenic as a dopant is merely exemplary and it is to be understood that alternative dopants known in the art may be utilized. The depth of the shallow junctions 22 is on the order of 0.1 μm or less. Sidewall insulators 20 are formed on the sidewalls of the gate 18. Typically, these sidewall insulators 20 comprise an oxide.

Figure 2:
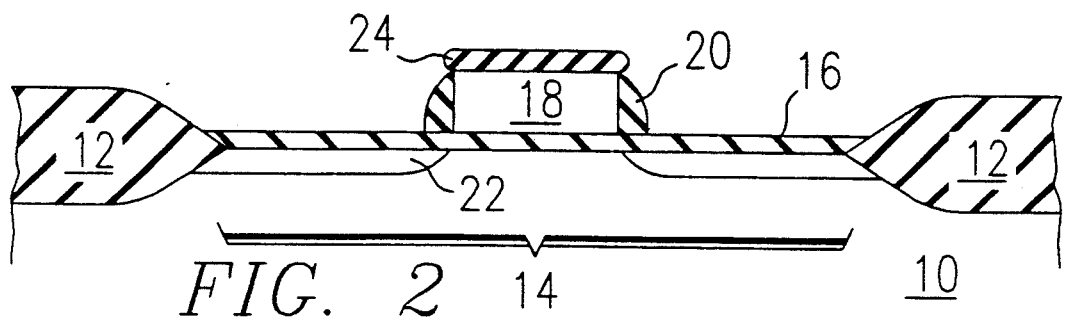
FIG. 2 illustrates a cross-sectional side view of the transistor of the preferred embodiment of the present invention after a second processing stage.

FIG. 2 illustrates a cross-sectional side view of the present invention after a second processing stage. A masking region 24 is formed over the gate 18. Such a mask may be created by growing an oxide over the gate 18. Since the polysilicon gate 18 is usually highly doped, and because oxidation occurs more rapidly over a heavier doped semiconductor, the oxide thickness over the polysilicon gate 18 will be larger than in the moat region 14. This thicker oxide will typically be on the order of 1000 Å in thickness and will be used to protect the polysilicon gate 18 during subsequent steps. It is to be noted that the structure depicted in FIG. 2 may be created by processes other than that described above. As such, the aforementioned processes are merely exemplary and the Applicants do not intend to limit their invention thereto.

Figure 3:
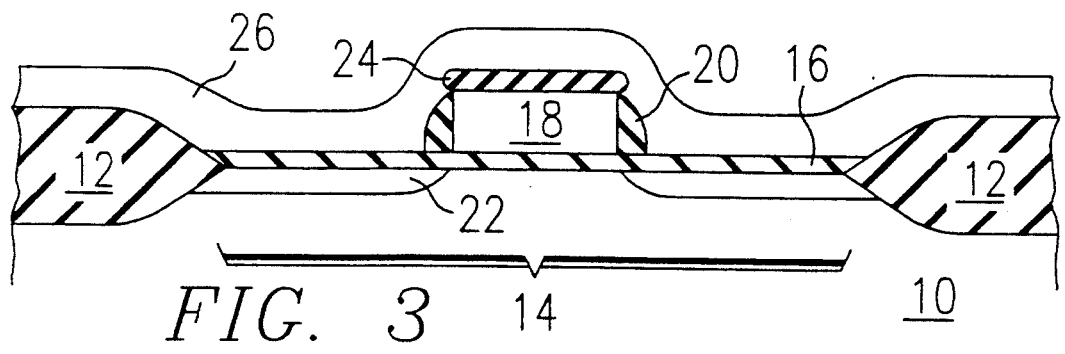
FIG. 3 illustrates a cross-sectional side view of the transistor of the preferred embodiment of the present invention after a third processing stage.

FIG. 3 illustrates a cross-sectional side view of the present invention following a third processing stage. In FIG. 3, a layer of polysilicon 26 of desired thickness has been placed over the entire transistor structure. While the thickness of layer 26 will vary according to desired criteria, layer 26 will typically be 1000–4000 Å in thickness.

Figure 4:
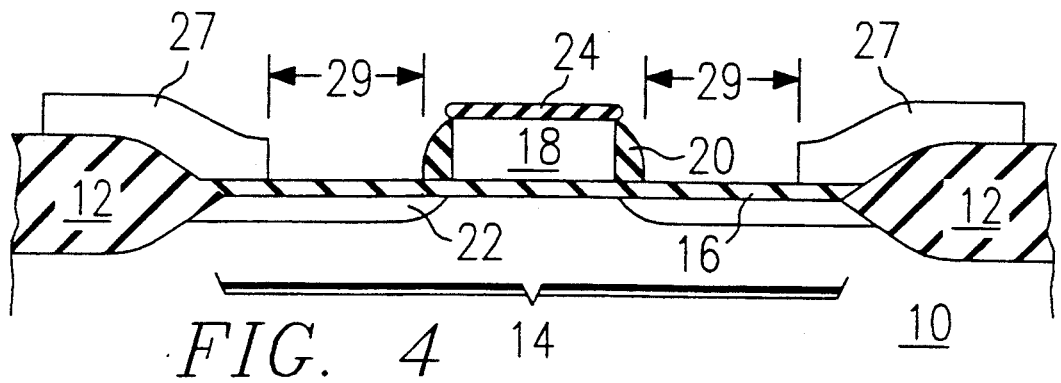
FIG. 4 illustrates a cross-sectional side view of the transistor of the preferred embodiment of the present invention after a fourth processing stage.

FIG. 4 illustrates a cross-sectional side view of the present invention following a fourth processing stage. The deposited polysilicon 26 of FIG. 3 is patterned such that it remains over the insulating regions 12 and overlaps the moat region 14 by a desired distance. This patterned layer creates spaced apart polysilicon pads 27 and defines interim areas 29 between the polysilicon pads 27 and the sidewall insulators 20.

Figure 5:
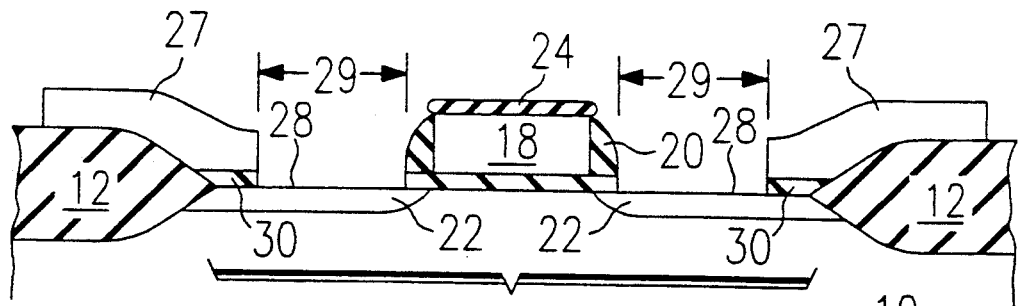
FIG. 5 illustrates a cross-sectional side view of the transistor of the preferred embodiment of the present invention after a fifth processing stage.

FIG. 5 illustrates a cross-sectional side view of the present invention subsequent to a fifth processing stage. The gate insulator 16 (see FIG. 4) within the interim area 29 is etched away leaving exposed substrate surfaces 28. Because of its larger thickness, the masking region 24 will partially remain after this etching step. Insulation 30 remaining under the polysilicon pad 27 serves to further reduce the junction capacitance of the transistor structure.

Figure 6:
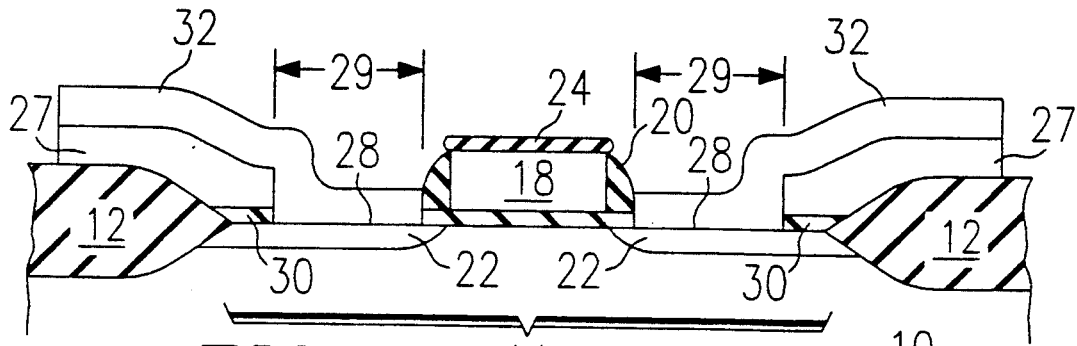
FIG. 6 illustrates a cross-sectional side view of the transistor of the preferred embodiment of the present invention after a sixth processing stage.

FIG. 6 illustrates a cross-sectional side view of the present invention following a sixth processing stage. A conductive layer 32 is formed selectively over the polysilicon pad 27 and over the exposed substrate surfaces 28 in the interim areas 29. This conductive layer 32 is commonly formed by using a selective epitaxial silicon deposition process. Since the epitaxial silicon will grow only over silicon areas, the growth is limited within interim area 29 on the exposed substrate 28 and on the poly silicon pad 27 extending from the moat 14 over the insulating region 12. The epitaxial silicon will not grow over the gate masking region 24, nor over the sidewall insulators 20.

Figure 7:
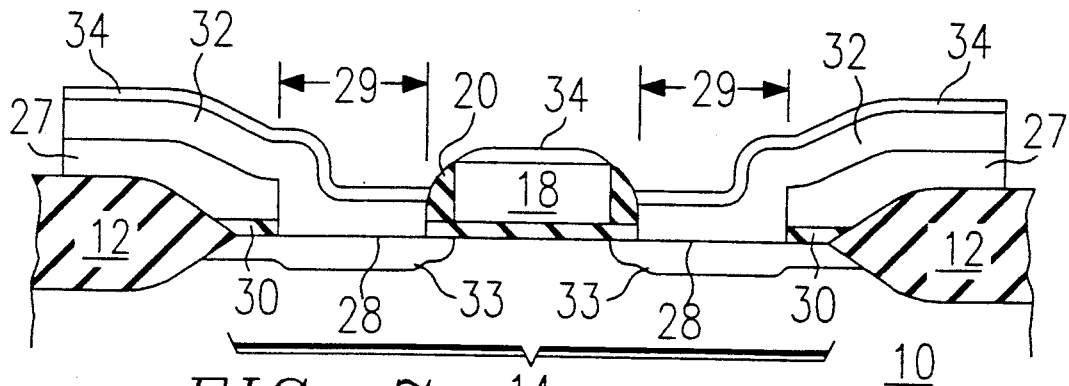
FIG. 7 illustrates a cross-sectional side view of the transistor of the preferred embodiment of the present invention after a seventh processing stage.

FIG. 7 illustrates a cross-sectional side view of the present invention following a seventh processing stage. The masking region 24 over the gate 18 is removed. Source/drain regions are formed by implantation into the conductive layer 32 thereby creating a deeper source/drain junction 33. Typically, doping results in a surface concentration of $10^{20}$/cm$^3$ at the interface of the conductive layer 32 and the silicided region 34. An example of common dopants includes arsenic or phosphorous for NMOS transistors, and boron for PMOS transistors. The optional use of shallow junction 22 (discussed in reference to FIG. 1) will be necessary depending on the lateral extent of deeper source/drain junction 33. Shallow junctions 22 should be used only to the extent that deeper junction 33 does not extend under and past the region below sidewall insulators 20. The junction depth corresponding to the heavily doped region below the substrate surface 28 will be on the order of 0.5–0.15 μm. It is noted that the final junction depth below the substrate surface 28 is determined both by the thickness of the conductive layer 32 as well as the implant energy used to dope the conductive layer 32. Hence, the final junction depth can be controlled by varying these parameters. Silicided regions 34 are formed over each conductive layer 32 while the sidewall insulator 20 prevents contact with the gate 18. FIG. 7 thus illustrates the formation of an improved transistor having an elevated source/drain region with a conducting layer 32 extending from moat 14 over field insulating regions 12.

Figure 8:
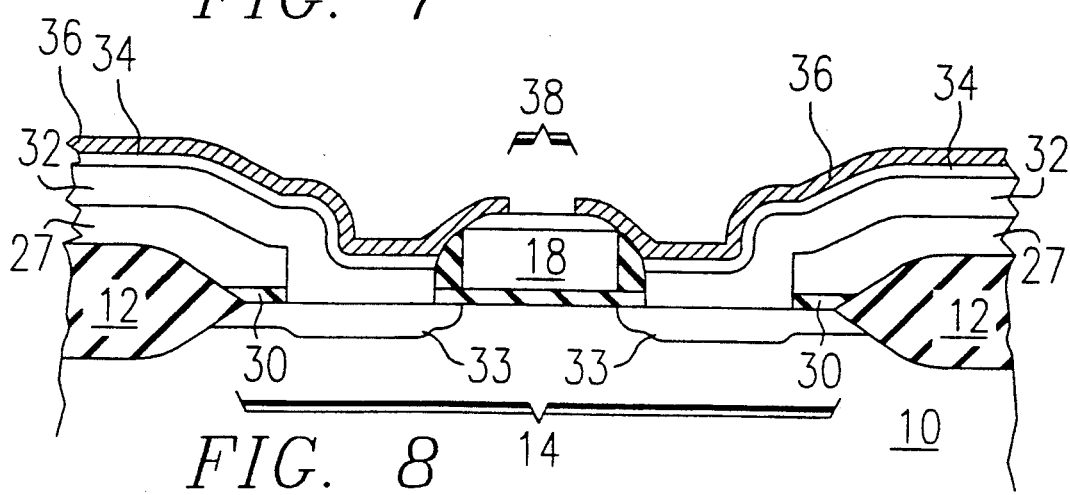
FIG. 8 illustrates a cross-sectional side view of the transistor of the preferred embodiment of the present invention after an eighth processing stage.

FIG. 8 illustrates a cross-sectional side view of the present invention following an eighth processing stage. In FIG. 8 inter-level oxide 36 has been formed over the silicide layer 34. The thickness of this inter-level oxide 36 is typically 1000 Å. A contact window 38 is etched in the inter-level oxide in a region overlying the gate 18.

Figure 9:
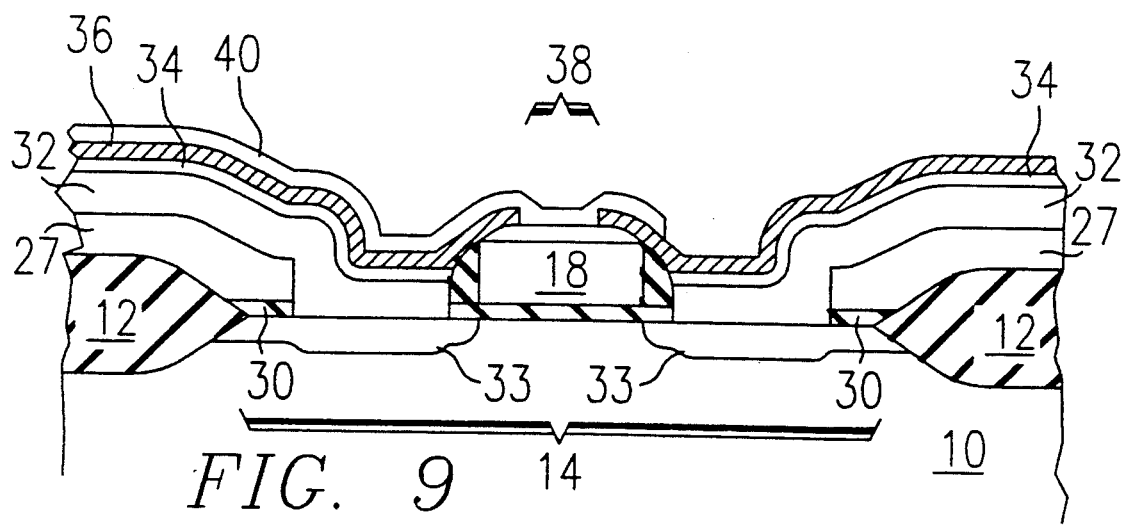
FIG. 9 illustrates a cross-sectional side view of the transistor of the preferred embodiment of the present invention after a ninth processing stage.

FIG. 9 illustrates a cross-sectional side view of the present invention following a ninth process stage. In this figure a TFT gate layer (not shown) has been deposited over contact window 38 and the remainder of the wafer surface. It is then patterned and etched to form the TFT gate 40 which is connected to underlying gate 18 through contact window 38. This gate is typically highly doped polysilicon.

Figure 10:
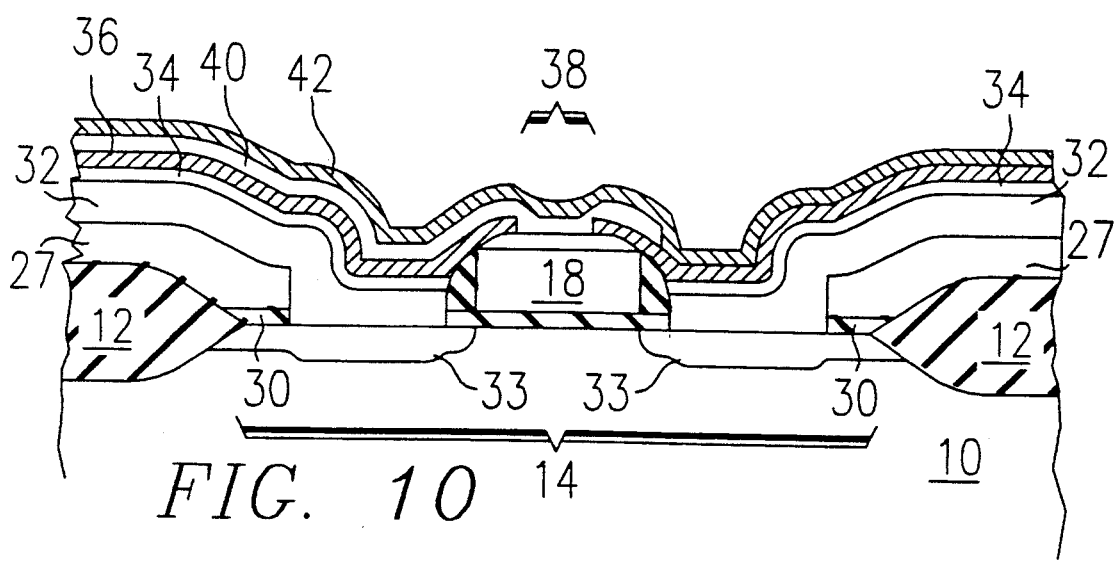
FIG. 10 illustrates a cross-sectional side view of the transistor of the preferred embodiment of the present invention after a tenth processing stage.

FIG. 10 illustrates a cross-sectional side view of the present invention following a tenth processing stage. In FIG. 10, a TFT gate insulator 42 has been deposited. This insulator has a typical thickness of 100 to 500 Å.

Figure 11:
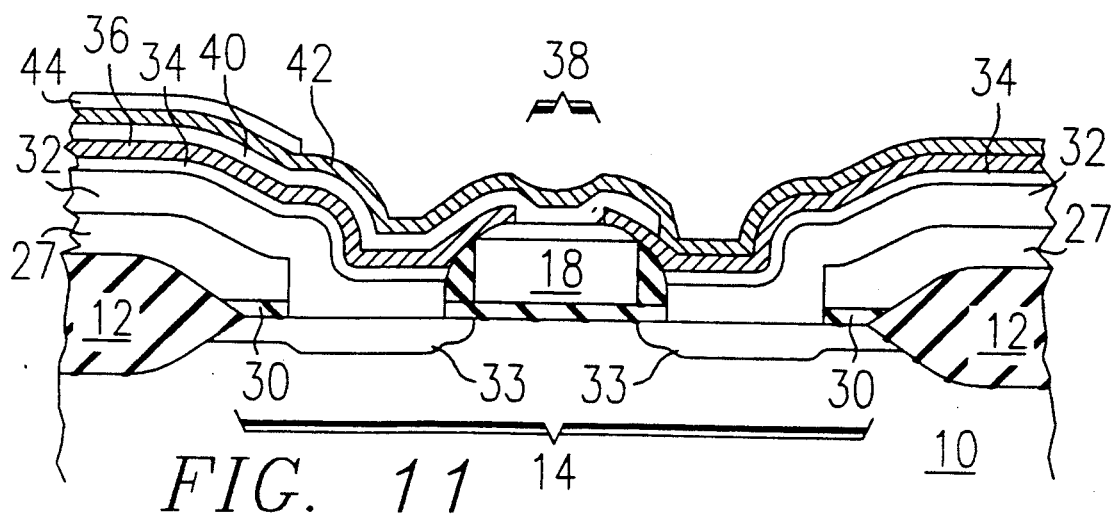
FIG. 11 illustrates a cross-sectional side view of the transistor of the preferred embodiment of the present invention after a fourth processing stage.

FIG. 11 illustrates a cross-sectional side view of the present invention following an eleventh processing stage. In this stage a TFT semiconductor film layer or TFT channel layer (not shown) has been blanket deposited. It is patterned and etched to form a TFT semiconductor element or a first TFT channel region 44 which terminates partially above selected TFT gate 40 with the TFT gate oxide 42 vertically interposed, and a second TFT channel region (not shown). This TFT semiconductor element 44 is typically polysilicon.

Figure 12:
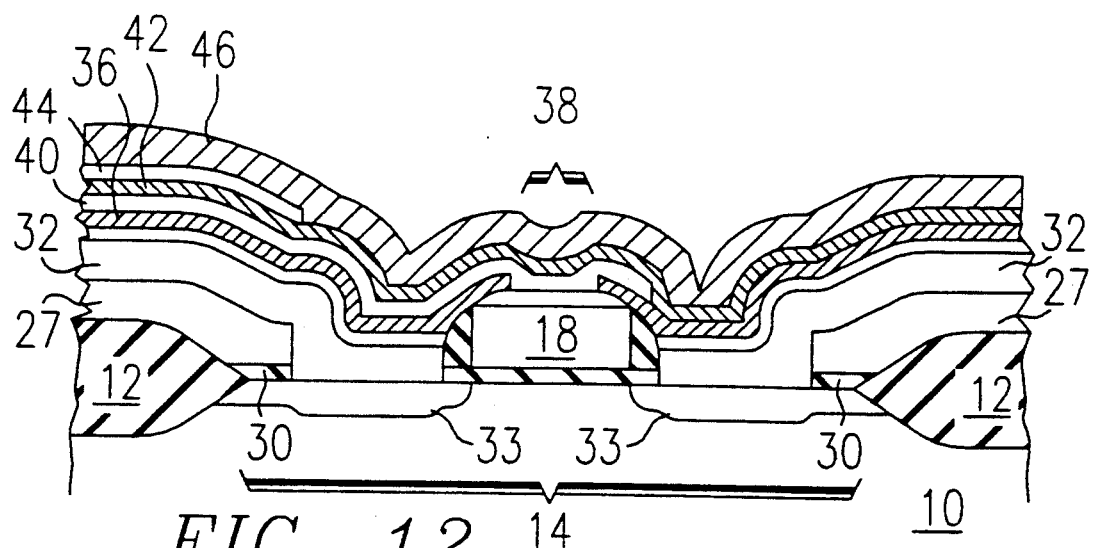
FIG. 12 illustrates a cross-sectional side view of the transistor of the preferred embodiment of the present invention after a twelfth processing stage.

FIG. 12 illustrates a cross-sectional side view of the present invention following a twelfth processing stage. In this figure a masking insulator 46 has been deposited over the entirety of the wafer.

Figure 13:
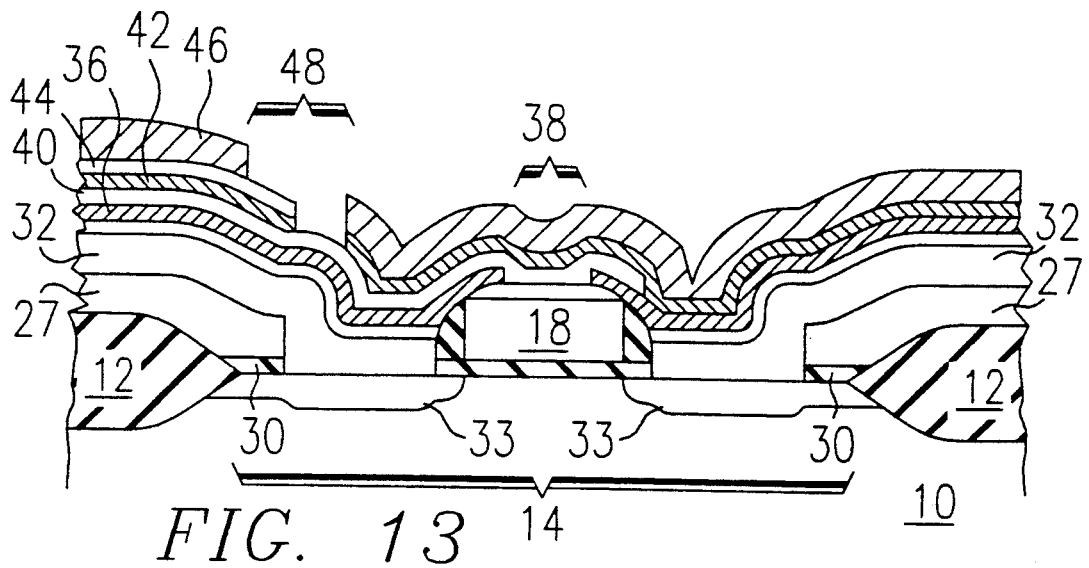
FIG. 13 illustrates a cross-sectional side view of the transistor of the preferred embodiment of the present invention after a thirteenth processing stage.

FIG. 13 illustrates a cross-sectional side view of the present invention following a thirteenth processing stage. In this figure a second contact window 48 has been selectively etched through portions of the masking oxide 46 and the TFT gate oxide 42. This contact window encompasses and overlaps a terminating point of the discrete TFT semiconductor element 44 and a portion of the TFT gate 40 to which the TFT semiconductor element 44 will be connected. Since the TFT semiconductor element 44 overlies the TFT gate oxide 42 when the second contact window is patterned/etched, the TFT gate oxide 42 has been protected from deleterious impurities introduced during the pattern/etch process.

Figure 14:
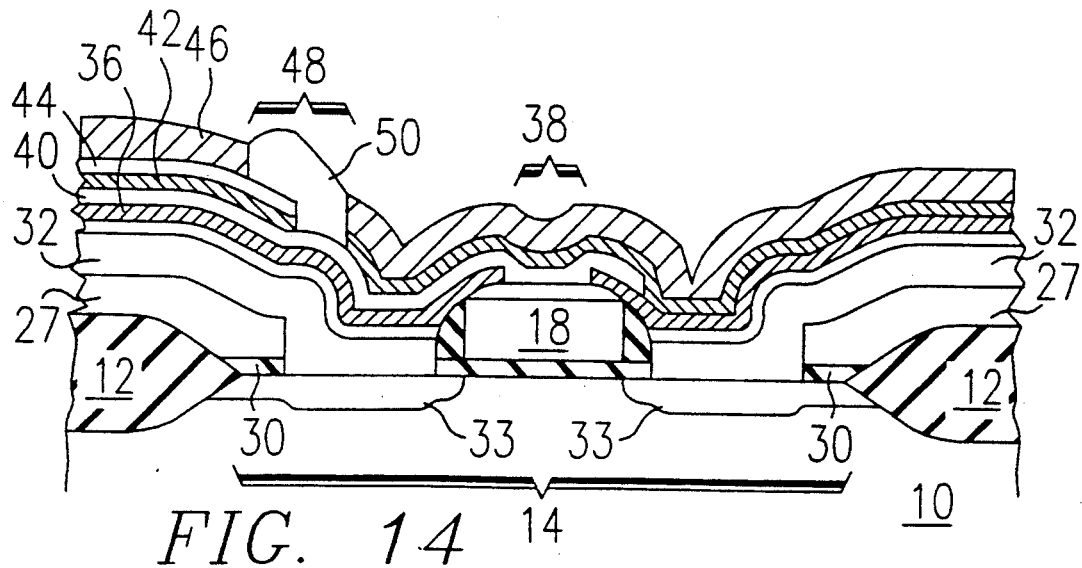
FIG. 14 illustrates a cross-sectional side view of the transistor of the preferred embodiment of the present invention after a fourteenth processing stage.

FIG. 14 illustrates a cross-sectional side view of the present invention following a fourteenth processing stage. In this figure a second conductive layer 50 is selectively grown within contact window 48, typically by selective epitaxy plus its associated in-situ cleaning process. The material deposited is typically silicon.

Figure 15:
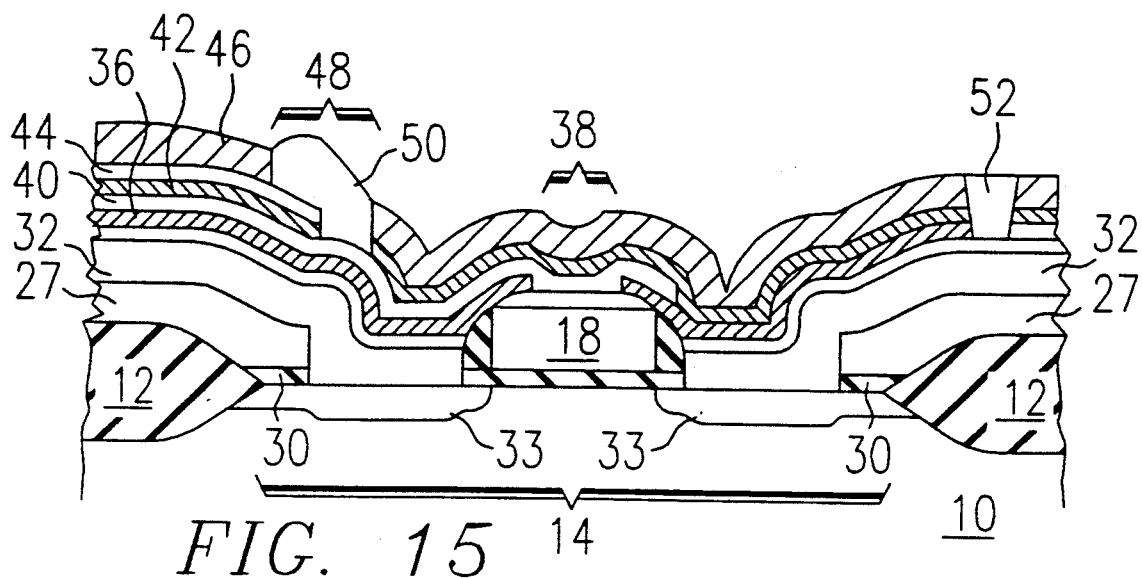
FIG. 15 illustrates a cross-sectional side view of the transistor of the preferred embodiment of the present invention after a fifteenth processing stage.
Figure 16:
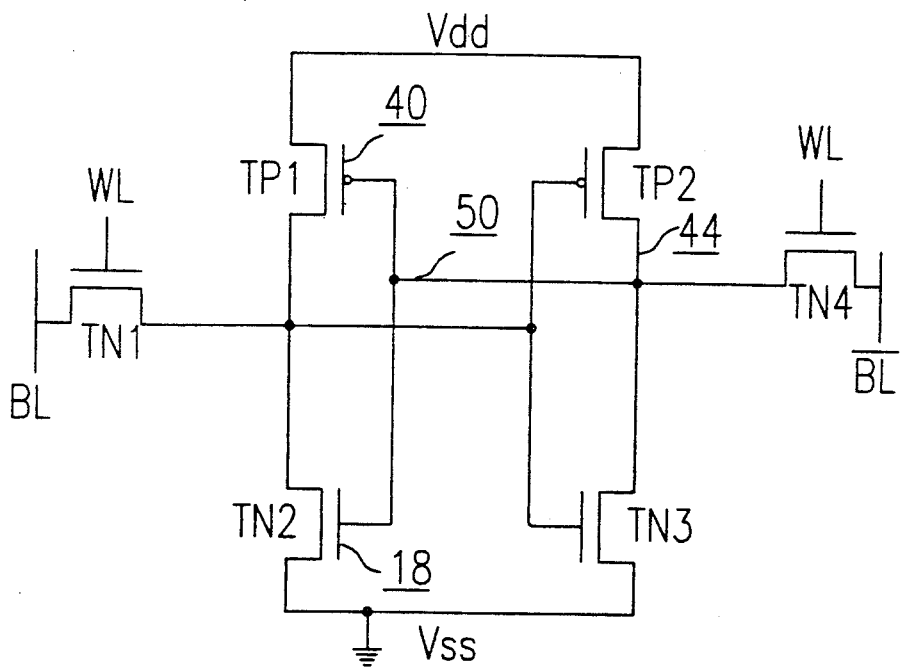
FIG. 16 schematically illustrates a 6T SRAM cell and associated circuitry incorporated in the preferred embodiment of the present invention.

FIG. 15 illustrates the improved device of FIG. 14 having a metal-1 contact 52 added thereto. The metal-1 contact 52 etch is effected through masking insulator 46, TFT gate insulator 42, and inter-level oxide 38. The metal-1 contact 52 is formed to the silicided region 34. Because the metal-1 contact 52 may overlie the insulating regions 12, the etch for the contact 52 may be effected over the insulating region 12 rather than over the moat 14. Thus, the possibility of etch damage to the moat 14 is eliminated.

FIG. 16 schematically illustrates a 6T SRAM. Comparison of FIG. 16 to FIG. 15 will help reveal the portion of the SRAM cell structure, depicted in FIG. 15. By reference to FIG. 16, gate 18 is the gate of transistor TN2, TFT gate layer 40 is the gate region of transistor TP1, and TFT semiconductor element 44 is the drain region of transistor TP2. Strap 50 connects TFT gate layer 40 to TFT semiconductor element 44.

The process and resulting product of the illustrated embodiment of the present invention provide many advantages over the prior art. A less complicated and problematic process is disclosed to produce an elevated source/drain transistor having reduced junction depths 33. Additionally, the transistor will have a conductive layer 32 which in effect extends silicon over the transistor insulating regions 12. As such, external contacts to the transistor need not be centered in the moat region 14 between the insulating regions 12 and the sidewall insulators 20. Instead, external contacts 36 may be placed within the conductive layer 32 over either the interim region 29 or the insulating region 12.

Additionally, this process provides for a compact stacked semiconductor structure having a non-overlapping, self-aligned connection 50 between circuit layers. In the preferred embodiment of the invention, these circuit layers comprised the TFT gate layer 40 and the TFT semiconductor element 44 of a 6T stacked SRAM. This process avoided problems associated with impurities and unintentional oxide formation associated with prior art devices by immediately depositing a conductive layer, in this example the TFT semiconductor element 44, immediately above the oxide layer (TFT gate oxide 42 in this example) before any patterning of the oxide layer. This process further goes on to form a contact hole 48 such that the two conductive layers 40,44 are adjacently exposed with an insulating layer 42 vertically interposed. These conductive layers 40,44 are connected by a selective growth 50 formed using a selective epitaxy technique which typically has an in-situ cleaning process such as hydrogen prebake or HF vapor. These cleaning techniques are known to be especially adept at removing interfacial oxides.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a stacked transistor structure comprising the steps of:
   a) forming first and second insulating regions defining a moat area in a semiconductor surface;
   b) forming a first gate insulator over said moat area;
   c) forming a gate over said first gate insulator;
   d) forming a second gate insulator which is a TFT gate insulator over said gate, such that said gate is a common gate for a first MOSFET transistor formed in said moat area and a second MOSFET transistor which is a first TFT;
   e) forming a TFT channel layer overlying said second gate insulator whereby the top surface of regions of said second gate insulator is protected from deleterious effects of further process steps;
   f) patterning said TFT channel layer to form a first channel region for said first TFT and a second channel region for a second TFT;
   g) forming a first insulating layer over said TFT channel regions and said TFT gate insulator;
   (h) selectively removing, using a selective etching process having an etching rate much greater for said first insulating layer and said TFT gate insulator than said TFT channel regions, said first insulating layer and said TFT gate insulator to form a contact region overlying an area of said first TFT channel region and an area of said common gate; and
   i) forming a conducting layer within said contact region.

2. The method of claim 1 wherein said conducting layer is formed using selective growth techniques whereby said conducting layer is self-aligned within said contact region.

3. The method of claim 1 wherein said conducting layer is formed using selective epitaxial growth techniques comprising in-situ cleaning techniques whereby interfacial oxides are removed from said common gate and said second TFT channel region.

4. A method of forming a transistor structure comprising the steps of:
   a) forming first and second insulating regions defining a moat area in a semiconductor surface;
   b) forming a gate insulator over said moat area;
   c) forming a first gate over said gate insulator;
   d) forming an interlevel insulator over the entirety of said moat area;
   e) patterning said interlevel insulator over said first gate to form a first contact hole;
   f) forming a second gate, which serves as a bottom gate for a first TFT, over said interlevel insulator and electrically connected to said first gate through said contact hole;
   g) forming a TFT gate insulator over said TFT bottom gate;
   h) forming a TFT channel layer over said TFT gate insulator whereby said TFT gate insulator is protected from deleterious effects of further process steps;

i) patterning said TFT channel layer to form a first channel region for said first TFT and a second channel region for a second TFT;

j) forming a first insulating layer over said TFT channel regions and said TFT gate insulator;

k) selectively removing, using a selective etching process having an etching rate much greater for said first insulating layer and said TFT gate insulator than said TFT channel regions, said first insulating layer and said TFT gate insulator to form a contact region straddling an area of said second TFT channel region and said TFT bottom gate; and l) forming a conducting layer within said contact region.

5. The method of claim 4 wherein said conducting layer is formed using selective growth techniques whereby said conducting layer is self-aligned within said contact region.

6. The method of claim 4 wherein said conducting layer is formed using selective epitaxial growth techniques comprising in-situ cleaning techniques whereby interfacial oxides are removed from said TFT bottom gate and said second TFT channel region.

* * * * *